US008017862B2

(12) United States Patent
Kida et al.

(10) Patent No.: US 8,017,862 B2
(45) Date of Patent: Sep. 13, 2011

(54) SOLAR-CELL SINGLE-CRYSTAL SILICON SUBSTRATE, SOLAR CELL ELEMENT, AND METHOD FOR PRODUCING THE SAME

(75) Inventors: Michio Kida, Kainan (JP); Wugen Pan, Kainan (JP); Kyojiro Kaneko, Kainan (JP); Kazuo Nakajima, Sendai (JP); Noritaka Usami, Sendai (JP); Kozo Fujiwara, Sendai (JP)

(73) Assignee: Sumco Solar Corporation, Wakayama (JP)

( * ) Notice: Subject to any disclaimer, the term of this patent is extended or adjusted under 35 U.S.C. 154(b) by 698 days.

(21) Appl. No.: 11/583,872

(22) Filed: Oct. 20, 2006

(65) Prior Publication Data

US 2007/0089781 A1   Apr. 26, 2007

(30) Foreign Application Priority Data

Oct. 21, 2005  (JP) .............................. 2005-306522
Aug. 7, 2006  (JP) .............................. 2006-214766
Sep. 22, 2006  (JP) .............................. 2006-256941

(51) Int. Cl.
*H01L 25/00* (2006.01)
*H01L 31/00* (2006.01)
*H02N 6/00* (2006.01)

(52) U.S. Cl. ..................... 136/261; 136/243; 136/252

(58) Field of Classification Search ............... 136/243, 136/261, 252
See application file for complete search history.

(56) References Cited

U.S. PATENT DOCUMENTS
6,815,605 B1 * 11/2004 Abe et al. .................... 136/261

FOREIGN PATENT DOCUMENTS
JP   2002-289887   10/2002
WO   WO 00/73542 A1   12/2000
WO   2004/007813   1/2004

OTHER PUBLICATIONS

"Solar Energy Technologies Program: Silicon." Energy Efficiency and Renewable Energy. Feb. 28, 2004. U.S. Department of Energy. May 26, 2009, 4 pages. <http://www1.eere.energy.gov/solar/silicon.html>.*
Garg et al. "Solar Energy: Fundamentals and Applications". Section 17.4.2 Methods of Growing Crystal. p. 393. New Delhi: Tata McGraw-Hill, 2000.*
Sopori, B. L. "Influence of substrate resistivity on the degredation of silicon solar cell performance due to crystal defects". Solar Energy Research Institute. IEEE. 1988.*

(Continued)

*Primary Examiner* — Basia Ridley
*Assistant Examiner* — Lindsey Bernier
(74) *Attorney, Agent, or Firm* — Clark & Brody

(57) ABSTRACT

In growing a single-crystal silicon by the present invention in a Czochralski method, after a surface of a silicon melt is brought into contact with a seed crystal in a crucible, the silicon melt being added with germanium, the single-crystal silicon is pulled while rotated, and the solar-cell single-crystal silicon substrate is sliced from the single-crystal silicon containing germanium, whereby a germanium content of solar-cell single-crystal silicon substrate is set in the range of not less than 0.03 mole % to less than 1.0 mole % when resistivity ranges from 1.4 to 1.9 Ωcm. Therefore, conversion efficiency is enhanced when compared with conventional single-crystal silicon substrates. Accordingly, solar cell power generation costs decreases, so that the single-crystal silicon of the present invention can widely be utilized as the substrate for the solar cell in which the high conversion efficiency is increasingly demanded.

4 Claims, 4 Drawing Sheets

OTHER PUBLICATIONS

W. Pan et al., "Ge composition dependence of properties of solar cells based on multicrystalline SiGe with microscopic compositional distribution", *American Institute of Physics*, vol. 96, No. 2, Jul. 15, 2004, pp. 1238-1241.

I. Yonenaga, "Growth and fundamental properties of SiGe bulk crystals", *Journal of Crystal Growth*, 275 (2005) 91-98.

J. Wollweber et al., "The Growth of $Si_XGe_{1-X}$-Crystals for Infrared Solar Cell Applications", First World Conference on Photovoltaic Energy, Dec. 5-9, 1994; Hawaii, pp. 1372-1374.

I. Yonenaga, "Czochralski growth of heavily impurity doped crystals of GeSi alloys", *Journal of Crystal Growth*, 226 (2001) 47-51.

W. Zhang et al., "Effective segregation coefficient and steady state segregation coefficient of germanium in Czochralski silicon", *Journal of Crystal Growth*, 169 (1996) 598-599.

N.V. Abrosimov, "Single crystal growth of $Si_{1-X}Ge_X$ by the Czochralski technique", *Journal of Crystal Growth*, 166 (1996) 657-662.

* cited by examiner

SOLAR-CELL SINGLE-CRYSTAL SILICON SUBSTRATE, SOLAR CELL ELEMENT, AND METHOD FOR PRODUCING THE SAME

FIELD OF THE INVENTION

The present invention relates to a solar-cell single-crystal silicon substrate containing germanium and a solar cell element, and more particularly to the solar-cell single-crystal silicon substrate which is obtained from a single crystal silicon produced by a Czochralski method (hereinafter referred to as "CZ method"), the solar cell element in which the solar-cell single-crystal silicon substrate is used, and a method for producing the same.

DESCRIPTION OF THE RELATED ART

Substrate materials for the solar cell element are mainly classified into an amorphous silicon material, a crystal silicon material, a compound semiconductor material, and an organic material. Conversion efficiency which is of the most important characteristics of the solar cell is indicated by a ratio of electric energy—which can be taken out—to light energy—which impinges on the solar cell. Currently, the maximum conversion efficiency is obtained in the compound semiconductor solar cell.

However, in producing the high-efficiency compound semiconductor solar cell, it is difficult to stably produce the compound semiconductor which is of the material for the solar cell, which increases production cost of the solar cell substrate. Therefore, the compound semiconductor material is applied only to the limited field.

Currently, the crystal silicon is widely used as the solar cell substrate material, because the high conversion efficiency of the crystal silicon is stably obtained though the conversion efficiency does not come up to that of the compound semiconductor. The crystal silicon accounts for 85% or more of annual shipment volume. The crystal silicon for the substrate material includes a single-crystal silicon and a polycrystalline silicon, and generally the solar cell element having the higher conversion efficiency is obtained when the single-crystal silicon is used as the substrate.

In the crystal silicon materials, high-purity silicon having an extremely small amount of impurities is used to obtain the higher conversion efficiency. The single-crystal silicon which is utilized for a substrate material of the semiconductor integrated circuit is used in the case where the single-crystal silicon is applied to the solar cell substrate material. The single-crystal silicon substrate material of the semiconductor integrated circuit is produced by the CZ method in which the single-crystal silicon is directly grown by pulling the single-crystal silicon from molten silicon. On the other hand, because the production cost is high in the single crystal growth by the CZ method, cast polycrystalline silicon obtained at lower cost is widely utilized although a little inferior to the single-crystal silicon in conversion efficiency.

The substrate is made by slicing the crystal silicon obtained by the CZ method or casting method into thin strips (wafers) having thicknesses of about 300 to about 400 μm. After mirror polishing is performed to a substrate surface, a doping agent diffusion process is applied to form a pn junction surface, an electrode is attached to the top surface and backside, and an antireflection coating is formed on a sunlight incident surface to yield the solar cell element.

The crystal silicon substrate for the semiconductor integrated circuit includes a p-type substrate and an n-type substrate, and both types can be used. In the solar cell element substrate, usually the p-type substrate in which a carrier lifetime becomes longer than that of the n-type substrate is used because mass production is easily realized.

In the solar cell element, various technical research and developments have been made on structures and modes to enhance the conversion efficiency, and a technology in which gallium (Ga) is used as a doping agent of the substrate is proposed as one of conventional technologies concerning the crystal silicon substrate material. For example, International Application Publication WO2000/073542 discloses a method for producing a Ga-doped single-crystal silicon, in which Ga is added as the doping agent to set resistivity in the range of 0.1 to 5 Ωcm when the single-crystal silicon for the substrate is grown by the CZ method.

Although boron (B) is usually used as the doping agent for providing conductivity to the solar-cell silicon crystal substrate, sometimes the carrier lifetime is decreased in the case where the substrate has the high resistivity. In the single-crystal silicon disclosed in International Application Publication WO2000/073542, even if oxygen exists, the resistivity can be decreased to obtain the high conversion efficiency without shortening the carrier lifetime by utilizing gallium as the doping agent instead of boron.

In the case where the polycrystalline silicon is used as the substrate, particularly many improvements are made to enhance the conversion efficiency while attention is paid to the low cost. For example, in Japanese Patent Application Publication No. 2002-289887, a melt in which 50 mole % of germanium—being of the same IV group element—is added and melted is cooled at a specific rate to form the polycrystalline silicon in which a silicon concentration distribution is dispersed in the range of 5 to 80 mole % in a microscopic portion of the crystal while a macroscopic component is homogenious as a whole, and thereby the conversion efficiency can be largely enhanced in the solar cell in which the above germanium-containing polycrystalline silicon substrate is used when compared with the polycrystalline substrate made of silicon alone.

According to Wugen Pan, et al., "Ge composition dependence of properties of solar cells based on multicrystalline SiGe with microscopic compositional distribution", Journal of Applied Physics, vol. 96, No. 2, p. 1238-1241 (2004) (hereinafter referred to as technical document), as a result of preparation and investigation of the solar cell using the substrate in which a small amount of germanium is added to the polycrystalline silicon, it is found that the conversion efficiency is enhanced while the maximum conversion efficiency is obtained at about 3 mole %. Although the reason why the conversion efficiency is enhanced by adding germanium to the polycrystalline silicon substrate is not necessarily established, it is presumed that the addition of germanium enhances an absorption coefficient of the sunlight in the solar cell element.

SUMMARY OF THE INVENTION

As described above, the single-crystal silicon substrate is used for the solar cell element having the practical use and high conversion efficiency. However, in the conventional technology, although there is a limited number of proposals of the single crystal in which the germanium is used as the doping agent to improve performance of the substrate material for the solar cell (for example, International Application Publication WO2000/073542), there are many cases that the single-crystal silicon produced for the semiconductor integrated circuit is directly utilized as the single-crystal substrate adopted for the solar cell as it is.

It is an object of the present invention to provide a single-crystal silicon substrate in which the conversion efficiency is further increased by particularly improving the performance of the solar cell substrate material in the solar cell element having the single-crystal substrate and a method for producing the same.

Both the single crystal and poly crystal can be used as the crystal silicon substrate for the solar cell element. Generally the conversion efficiency becomes high when the single crystal is used as the substrate, and when the poly crystal is used as the substrate, the cost is reduced while the poly crystal is inferior to the single crystal in conversion efficiency. When the higher conversion efficiency is achieved, power generation cost is reduced by utilizing the single crystal as the substrate, even if the cost of the solar cell element is relatively increased. From this standpoint, the present inventors study the single crystal substrate material for the single-crystal silicon substrate to enhance the conversion efficiency of the solar cell element.

The present inventors found that, in the solar cell element in which the polycrystalline silicon is used as the substrate, the conversion efficiency of the solar cell element is enhanced when the substrate containing germanium is used (see Japanese Patent Application Publication No. 2002-289887 and the technical document). In this case, although the germanium makes a complete solid solution within silicon, the germanium is inhomogeneously distributed in the crystal silicon from the microscopic viewpoint, and it is thought that the microscopically inhomogeneous distribution of the germanium increases the absorption coefficient of the sunlight.

In the single-crystal silicon, because it is presumed that the microscopically inhomogeneous distribution of the germanium should not occur, it has been considered that the addition of the germanium has no influence. However, when the single-crystal silicon in which the germanium is added is grown by the CZ method to use the germanium-containing single-crystal silicon as the substrate for the solar cell element, it is found that the conversion efficiency is largely enhanced in the germanium-containing single-crystal silicon substrate compared with the conventional single crystal substrate.

It is further found that the enhancement of the conversion efficiency is caused by interaction between the germanium and a doping agent which is added to provide the conductivity to the crystal silicon in combination with the germanium addition.

Therefore, the present inventors further study the amount of added germanium and the single-crystal growing conditions of the CZ method to make clear the limitations of these effects, which leads to completion of the present invention. Accordingly, the present invention includes the following summaries, i.e., (1) and (2) for a solar-cell single-crystal silicon substrate and (3) for a method for producing the same.

(1) A solar-cell single-crystal silicon substrate is characterized in that a germanium content is not less than 0.1 mole % and less than 1.0 mole %. Desirably a solar-cell single-crystal silicon substrate is characterized in that a germanium content is not less than 0.1 mole % and not more than 0.6 mole %.

(2) A solar-cell single-crystal silicon substrate is characterized in that resistivity ranges from 1.4 to 1.9 Ωcm and a germanium content is not less than 0.03 mole % and less than 1.0 mole %.

In the solar-cell single-crystal silicon substrate of the present invention, the solar-cell single-crystal silicon substrate may be sliced from single-crystal silicon pulled by a CZ method.

In the solar-cell single-crystal silicon substrate by the present invention, after a surface of the single-crystal silicon substrate is polished, a pn junction surface is formed, an electrode is attached to a top and backside surface thereof, and an antireflection coating may be formed on a sunlight incident surface to complete the solar cell element.

(3) A method for producing a solar-cell single-crystal silicon substrate is characterized in that, in growing single-crystal silicon by a CZ method, after familiarizing a silicon melt with a seed crystal by bringing the seed crystal into contact with the surface of the silicon melt in a crucible, the silicon melt being added with germanium, the single-crystal silicon is pulled while rotated, and the solar-cell single-crystal silicon substrate is sliced from the single-crystal silicon containing germanium.

In the method for producing a solar-cell single-crystal silicon substrate according to the present invention, a germanium content may be adjusted in the range of not less than 0.1 mole % to less than 1.0 mole % according to a growth length of the single-crystal silicon. Desirably the germanium content may be adjusted in the range of not less than 0.1 mole % to not more than 0.6 mole %.

In the method for producing a solar-cell single-crystal silicon substrate producing method according to the present invention, a germanium content may be adjusted in the range of not less than 0.03 mole % to less than 1.0 mole % according to a growth length of the single-crystal silicon when resistivity of the grown single-crystal silicon ranges from 1.4 to 1.9 Ωcm.

According to the solar-cell single-crystal silicon substrate by the present invention, the germanium content is set in the range of not less than 0.1 mole % to less than 1.0 mole %, and desirably the germanium content is adjusted in the range of not less than 0.1 mole % to not more than 0.6 mole %, and the germanium content is adjusted in the range of not less than 0.03 mole % to less than 1.0 mole % in the case of intermediate resistivity. Therefore, the conversion efficiency is largely enhanced in the single-crystal silicon substrate by the present invention compared with the case where the conventional single-crystal silicon substrate is used, so that solar cell power generation cost can be reduced.

DETAILED DESCRIPTION OF THE PREFERRED EMBODIMENTS

In a solar-cell single-crystal silicon substrate according to the present invention, a germanium content is not less than 0.1 mole % and less than 1.0 mole %. In the solar-cell single-crystal silicon substrate by the present invention, desirably the germanium content is not less than 0.1 mole % and not more than 0.6 mole %. Accordingly, the solar-cell single-crystal silicon substrate by the present invention differs largely from the conventional single-crystal substrate in the aspect that germanium is contained although containing the doping agent to provide conductivity like the normal single-crystal substrate.

The lower limit of the germanium content in the solar-cell single-crystal silicon substrate by the present invention is restricted by the fact that the conversion efficiency is not sufficiently enhanced when the germanium content is less than 0.1 mole %.

On the other hand, when the solar-cell single-crystal silicon substrate by the present invention contains 1.0 mole % or more of germanium, many dislocations and poly crystals are generated during pulling the single crystal to hardly grow the sound single crystal. The solar cell element having the high conversion efficiency is not obtained even if the solar cell element is produced using the substrate sliced from the single crystal containing 1.0 mole % or more of germanium. Therefore, the germanium content is set less than 1.0 mole %.

Figure 1:
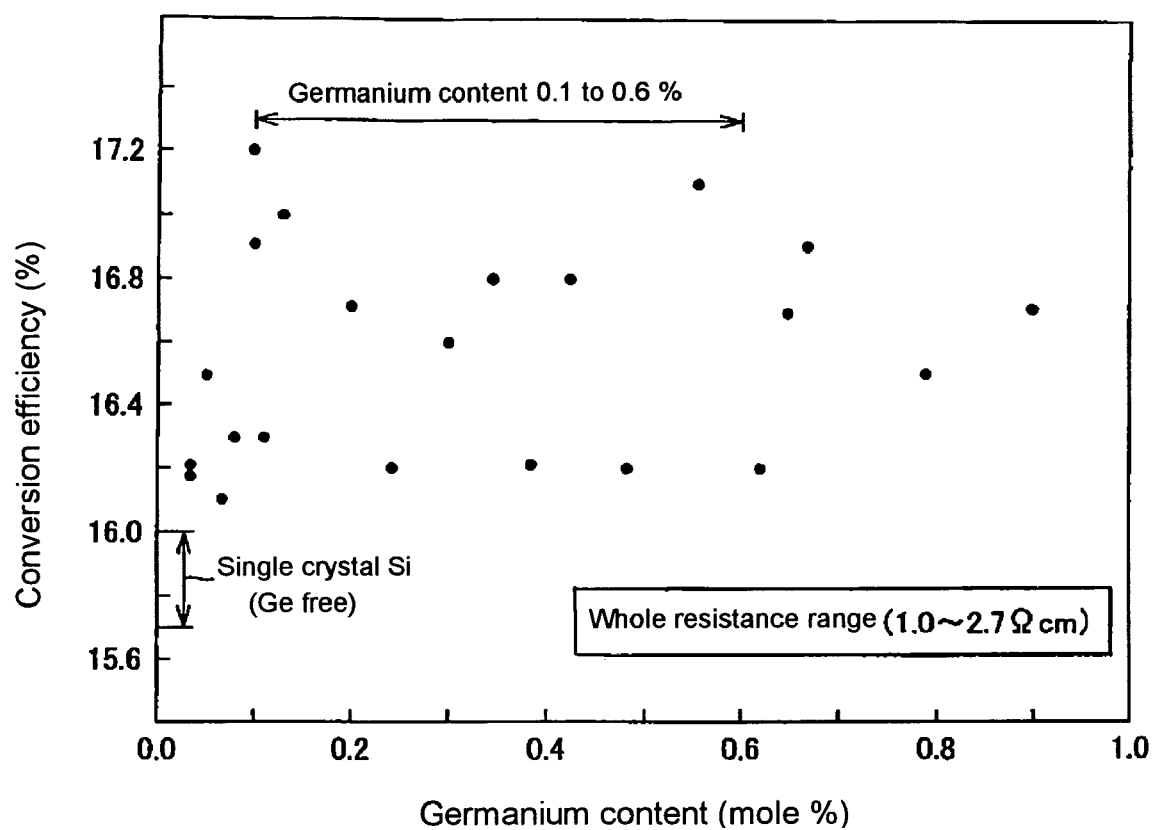
FIG. 1 shows a relationship between a germanium content and conversion efficiency of a solar cell element in overall resistance range.

More desirably, as shown in FIG. 1, the upper limit of the germanium content can be set 0.6 mole % to stably secure the conversion efficiency over the wide range of the resistivity of the single crystal substrate.

The reason why the solar-cell single-crystal silicon substrate of the present invention contains the germanium to enhance the conversion efficiency is not necessarily established, however, the carrier lifetime is lengthened compared with the single-crystal silicon substrate which is produced on the same conditions while the germanium is not added. Therefore, it is presumed that the conversion efficiency is enhanced by lengthening the carrier lifetime.

In the solar-cell single-crystal silicon substrate by the present invention, it is presumed that the enhancement of the conversion efficiency is achieved by interaction between the germanium and the impurities or the doping agent which is added in combination with the germanium addition to provide conductivity to the crystal silicon. Therefore, when the resistivity of the single-crystal silicon substrate lies within a predetermined range, the conversion efficiency can sufficiently be enhanced even if the germanium content does not reach 0.1 mole %.

That is, in the case where the single-crystal silicon substrate has the intermediate resistivity, e.g., in the case where the resistance ranges from 1.4 to 1.9 $\Omega$cm, the conversion efficiency can sufficiently be enhanced when the germanium content is not less than 0.03 mole %.

On the other hand, when the single-crystal silicon substrate has the low resistivity of not more than 1.0 $\Omega$cm because the single-crystal silicon substrate includes the large amount of doping agent or impurities, the effect of inclusion of the doping agent or impurities becomes dominant in the crystal, which decreases the interaction effect generated by containing the germanium. When the single-crystal silicon substrate has the high resistivity not less than 2.0 $\Omega$cm because the single-crystal silicon substrate includes the small amount of doping agent or impurities, the interaction effect to be generated by containing the germanium cannot be exerted. Therefore, when the single-crystal silicon substrate has the low resistivity, or when the single-crystal silicon substrate has the high resistivity, it is necessary that the germanium content be not less than 0.1 mole %.

In the solar-cell single-crystal silicon substrate by the present invention, because the p-type semiconductor is formed, the boron which is usually used as the doping agent can be used, and gallium can also be used. When the gallium is used as the doping agent, it is presumed that a decrease in conversion efficiency caused by a long-term use or existence of oxygen can be reduced.

In the solar-cell single-crystal silicon substrate by the present invention, desirably the resistivity ranges from 0.5 to 10 $\Omega$cm to prevent the decrease in conversion efficiency. When the resistivity is less than 0.5 $\Omega$cm, the carrier lifetime becomes shortened. When the resistivity exceeds 10 $\Omega$cm, internal resistance becomes excessively large to decrease a fill factor. As described above, the interaction effect between the containing of the germanium and the doping agent or impurities can appropriately be expected in the range of 1.4 to 1.9 $\Omega$cm.

In the production of the germanium-containing single-crystal silicon substrate, the single crystal can be grown by applying the CZ method which is generally used to produce the single-crystal silicon substrate of the semiconductor integrated circuit, and the substrate is formed by slicing the single crystal obtained by the CZ method.

In the CZ method adopted in the present invention, a predetermined amount of raw materials such as the polycrystalline silicon, germanium or germanium-containing silicon mother alloy, and doping agent are melted to form a melt in the crucible, the melt is familiarized with the seed crystal by bringing the seed crystal into contact with the surface of the melt, and the germanium-containing single crystal is grown by pulling the single crystal while the single crystal is rotated.

The germanium has the segregation coefficient of 0.43 to the silicon, and a concentration of the melt is adjusted from the germanium content in the single crystal, which is of a management target. Due to the segregation coefficient of the germanium, the germanium concentration is increased in the melt according to the growth length of the pulled single crystal, and the polycrystalline silicon is easily generated when the germanium content is brought dose to 1% in the single crystal. Therefore, in consideration of the concentration of the residual melt, it is necessary to select an initial melt amount, the germanium concentration, a growth length of the single crystal, and the like.

EXAMPLES

Example 1

In Example 1, the total weight of 25 kg of the melting-raw-materials such as the polycrystalline silicon, the germanium, and the doping agent was loaded into a quartz crucible having a diameter of 350 mm, heated and melted, and then, the single crystal having the diameter of 106 mm (4 inches) was pulled and grown from the melt by the CZ method. With reference to the growth conditions, a pulling rate was set at 1.2 mm/min, the number of revolutions of the crystal was set at 25 rpm, the number of revolutions of the crucible was set at 10 rpm, and argon pressure in the crucible was set at 2667 Pa (20 Torr). A hot zone in which an average temperature gradient of the single crystal was 2.5° C./mm at the point away from the melt surface during the pulling process is used.

The boron (B) or gallium (Ga) which is of the p-type doping agent was added to produce a comparative germanium-free single crystal and the germanium-containing single crystal such that the resistivity of the single crystal could range from 1 to 2 $\Omega$cm.

In the germanium-containing single crystal, when the single crystal was grown while the target concentration of the initial melt was set at 1 mole %, the germanium concentration was 0.43 mole % in a body top portion of the single crystal, the germanium concentration was 0.49 mole % at the position where the single crystal of 200 mm was grown, and the germanium concentration was 0.55 mole % at the position where the single crystal of 370 mm was grown.

Then, the pulling of the single crystal was stopped, because the growth of the poly crystal should get started around the position where the growth length of the single crystal exceeds 500 mm. The start of the growth of the poly crystal around the position where the growth length exceeds 500 mm is attributed to the fact that, according to the decrease in melt by the pulling of the single crystal, the germanium concentration is increased to reach the single crystal germanium content not less than 1 mole % as the growth length gets longer and longer.

The obtained single crystal was sliced to form wafers having the thickness of 400 µm, a square specimen of 15 mm in side dimension was cut out from the wafer to form the substrate, and the mirror polishing was performed to the surface of the substrate. Then, after chemical etching, an n-layer was formed by phosphorous diffusion, and the solar cell element was produced by performing the formation of the anti-reflection coating, baking of the electrode, and the like.

The performance of the solar cell element was measured with a testing instrument (YQ-250BX: product of JASCO) while a solar simulator (100 mW/cm$^2$) of AM1.5 was used as a light source. Table 1 shows the measurement result of the solar cell element characteristics. The values shown in Table 1 are an average of measurement values of the solar cell elements formed by the specimens sampled from a center portion and a peripheral portion of the wafer. The results shown in Table 1 are the measurement values in which 645 g of boron (B) was charged as the p-type doping agent.

It was confirmed that the conversion efficiency was further stabilized when the gallium was used as the p-type doping agent.

Example 2

In Example 2, the total weight of 25 kg of the melting-raw-materials such as the polycrystalline silicon, the germanium, and the doping agent were loaded into the quartz crucible having the diameter of 350 mm, and the single crystal having the diameter of 106 mm (4 inches) was grown from the melt by the pulling in the CZ method after the melting-raw-materials were heated and melted. The same growth conditions as Example 1 were set to grow seven kinds of crystals A to G whose amounts of added germanium differed from one another.

As shown in Table 2, the amounts of added germanium were set in the range of 0 to 645 g in the crystals A to G, and each length thereof was set at 1200 mm in the single crystal ingots which were pulled and grown from the melt after the heating and melting. In the growth of the crystals F and G, after 645 g of germanium was added and melted into the polycrystalline silicon melting-raw-material of 25 kg, the crystal F was first pulled and taken out from the crucible, the inside of the crucible was stabilized, and then the crystal G was pulled.

The boron (B) which is of the p-type doping agent was added to produce a comparative germanium-free single crystal and the germanium-containing single crystal such that the resistivity of each of the single crystal ingots (crystals A to G) should range from 1 to 3 Ωcm to form the low-resistivity

TABLE 1

| | | | | Solar cell element characteristics | | | | |
|---|---|---|---|---|---|---|---|---|
| Test No. | Ge content (mole %) | Dopant | Resistivity (Ω cm) | Short circuit current (mA/cm$^2$) | Open-circuit voltage (V) | Fill factor | Conversion efficiency (%) | Remarks |
| 1 | 0 | B | 1-2 | 37.1 | 0.580 | 0.742 | 15.8 | Comparative example |
| 2 | 0.43 | B | 1-2 | 38.1 | 0.582 | 0.756 | 16.7 | Example 1 |
| 3 | 0.48 | B | 1-2 | 36.8 | 0.579 | 0.760 | 16.2 | Example 1 |
| 4 | 0.55 | B | 1-2 | 39.1 | 0.587 | 0.744 | 17.1 | Example 1 |

Test No. 1 of Table 1 is the result of the solar cell element by the substrate produced from the germanium-free single crystal. Test No. 2 is the result of the solar cell element by the substrate taken out from the single crystal which was grown while the germanium concentration of the melt was set at 1 mole %. Test No. 3 is the result of the solar cell element by the substrate taken out from the evaluation position which is located at 190 mm below from the body top portion of the same single crystal. Test No. 4 is the result of the solar cell element by the substrate taken out from the evaluation position which is located at 370 mm below from the body top portion of the same single crystal.

As is clear from these results, when compared with the element by the germanium-free single-crystal silicon of Test No. 1, the conversion efficiency is largely enhanced in Test Nos. 2 to 4 in which the germanium was contained in the single crystal substrate.

In addition to the measurement shown in Table 1, the solar cell element was produced with the single crystal in which the gallium was used as the doping agent, and the element characteristics were measured on the same conditions as Table 1.

single crystal, the intermediate-resistivity single crystal, and the high-resistivity single crystal respectively.

TABLE 2

| Crystal | Si raw material (Kg) | Amount of added Ge (g) | Length of pulled ingot and evaluation position (mm) |
|---|---|---|---|
| A | 25 | 0 | Length of pulled ingot: 1200 |
| B | 25 | 40 | Evaluation positions: distance |
| C | 25 | 80 | from body top portion |
| D | 25 | 160 | (0, 400, . . .) |
| E | 25 | 320 | |
| F | 25 | 645 | |
| G | | | |

The obtained crystals A to G were sliced at predetermined evaluation positions to form wafers having the thickness of 400 µm. Each of the evaluation positions was managed by a distance from the body top portion of the grown single crystal ingot, and the germanium content, resistivity, and carrier lifetime were measured at each evaluation position. As regards the measurement of the carrier lifetime, a surface damage layer was etched with hydrofluoric acid after the obtained wafer was polished, a surface oxide layer was removed with buffered hydrofluoric acid (BHF), and the carrier lifetime was measured by a μ-PCD method.

Further, the square specimen of 15 mm in side dimension was cut out from the sliced wafer, and its surface was polished. After the chemical etching, the n-layer was formed by doping the phosphorous, and the solar cell element was produced by performing the formation of the anti-reflection coating, baking of the electrode, and the like. The performance of the solar cell element was measured on the same conditions as Example 1.

Tables 3 and 4 show the measurement results of the crystal characteristics and solar cell element characteristics at each evaluation position. The values shown in Tables 3 and 4 are the average of measurement values of the solar cell elements formed by the specimens taken out from the center portion and peripheral portion of the wafer.

TABLE 3

| Test No. | Crystal | Evaluation position (mm) | Ge content (mole %) | Crystal characteristics | | Solar cell element characteristics | | | | Remarks |
|---|---|---|---|---|---|---|---|---|---|---|
| | | | | Resistivity (Ω cm) | Lifetime (μs) | Short-circuit current (mA/cm$^2$) | Open-circuit voltage (V) | Fill factor | Conversion efficiency (%) | |
| 11 | A | 0 | *0 | 2.7 | 22.2 | 37.4 | 0.580 | 0.727 | 15.8 | Comparative Examples |
| 12 | A | 400 | *0 | 2.1 | 17.4 | 37.8 | 0.580 | 0.730 | 16.0 | Comparative Examples |
| 13 | A | 800 | *0 | 1.6 | 22.0 | 37.1 | 0.580 | 0.732 | 15.8 | Comparative Examples |
| 14 | A | 1150 | *0 | 1.0 | 16.5 | 37.3 | 0.583 | 0.722 | 15.7 | Inventive Examples |
| 15 | B | 0 | 0.03 | 1.9 | 11.9 | 37.4 | 0.587 | 0.740 | 16.2 | Inventive Examples |
| 16 | B | 400 | 0.03 | 1.6 | 9.5 | 37.3 | 0.585 | 0.744 | 16.2 | Inventive Examples |
| 17 | B | 800 | 0.05 | 1.4 | 11.6 | 37.7 | 0.594 | 0.740 | 16.5 | Inventive Examples |
| 18 | B | 1110 | 0.10 | 1.0 | 8.7 | 37.8 | 0.599 | 0.746 | 16.9 | Inventive Examples |
| 19 | C | 0 | *0.07 | 2.2 | 14.5 | 37.1 | 0.585 | 0.743 | 16.1 | Comparative Examples |
| 20 | C | 400 | 0.08 | 1.9 | 12.9 | 37.4 | 0.587 | 0.745 | 16.3 | Inventive Examples |
| 21 | C | 800 | 0.11 | 1.4 | 13.0 | 37.1 | 0.594 | 0.743 | 16.3 | Inventive Examples |
| 22 | C | 1110 | 0.20 | 1.1 | 12.0 | 37.6 | 0.596 | 0.749 | 16.7 | Inventive Examples |

Note)
The sign "*" in Table 3 shows that the Ge content deviates from the range defined by the present invention

TABLE 4

| Test No. | Crystal | Evaluation position (mm) | Ge content (mole %) | Crystal characteristics | | Solar cell element characteristics | | | | Remarks |
|---|---|---|---|---|---|---|---|---|---|---|
| | | | | Resistivity (Ω cm) | Lifetime (μs) | Short-circuit current (mA/cm$^2$) | Open-circuit voltage (V) | Fill factor | Conversion efficiency (%) | |
| 23 | D | 0 | 0.10 | 2.1 | 9.9 | 39.0 | 0.595 | 0.738 | 17.2 | Inventive Examples |
| 24 | D | 400 | 0.13 | 1.7 | 11.4 | 38.4 | 0.590 | 0.751 | 17.0 | Inventive Examples |
| 25 | D | 1110 | 0.38 | 1.1 | 4.8 | 36.7 | 0.588 | 0.751 | 16.2 | Inventive Examples |
| 26 | E | 0 | 0.24 | 2.0 | 5.0 | 38.1 | 0.583 | 0.730 | 16.2 | Inventive Examples |
| 27 | E | 400 | 0.30 | 1.7 | 4.1 | 38.7 | 0.588 | 0.729 | 16.6 | Inventive Examples |
| 28 | E | 800 | 0.43 | 1.4 | 4.1 | 38.5 | 0.593 | 0.736 | 16.8 | Inventive Examples |
| 29 | E | 1060 | 0.67 | 1.1 | 3.6 | 38.2 | 0.596 | 0.742 | 16.9 | Inventive Examples |
| 30 | F | 0 | 0.34 | 2.0 | 22.9 | 38.1 | 0.582 | 0.756 | 16.8 | Inventive Examples |
| 31 | F | 200 | 0.48 | 1.8 | 27.7 | 36.8 | 0.580 | 0.760 | 16.2 | Inventive Examples |
| 32 | F | 370 | 0.55 | 1.6 | 36.1 | 39.1 | 0.587 | 0.744 | 17.1 | Inventive Examples |

TABLE 4-continued

| Test No. | Crystal | Evaluation position (mm) | Ge content (mole %) | Crystal characteristics | | Solar cell element characteristics | | | | Remarks |
|---|---|---|---|---|---|---|---|---|---|---|
| | | | | Resistivity (Ω cm) | Lifetime (μs) | Short-circuit current (mA/cm$^2$) | Open-circuit voltage (V) | Fill factor | Conversion efficiency (%) | |
| 33 | G | 400 | 0.62 | 1.6 | 10.0 | 37.1 | 0.583 | 0.747 | 16.2 | Inventive Examples |
| 34 | G | 800 | 0.65 | 1.6 | 9.0 | 37.5 | 0.589 | 0.756 | 16.7 | Inventive Examples |
| 35 | G | 1070 | 0.79 | 1.4 | 8.2 | 37.5 | 0.590 | 0.746 | 16.5 | Inventive Examples |
| 36 | G | 1200 | 0.90 | 1.4 | 10.2 | 37.5 | 0.590 | 0.753 | 16.7 | Inventive Examples |

FIG. 1 shows a relationship between the germanium content and the conversion efficiency of the solar cell element in the whole resistance range. As is clear from the result shown in FIG. 1, when compared with the solar cell element by the germanium-free single-crystal silicon, the conversion efficiency is enhanced in the solar cell element in which the germanium is added into the single crystal substrate in the range of not less than 0.1 mole % to less than 1.0 mole %. Furthermore, as is clear from the result shown in FIG. 1, the conversion efficiency is enhanced more stably in the solar cell element in which the germanium is added into the single crystal substrate in the range of not less than 0.1 mole % to not more than 0.6 mole %.

Figure 2:
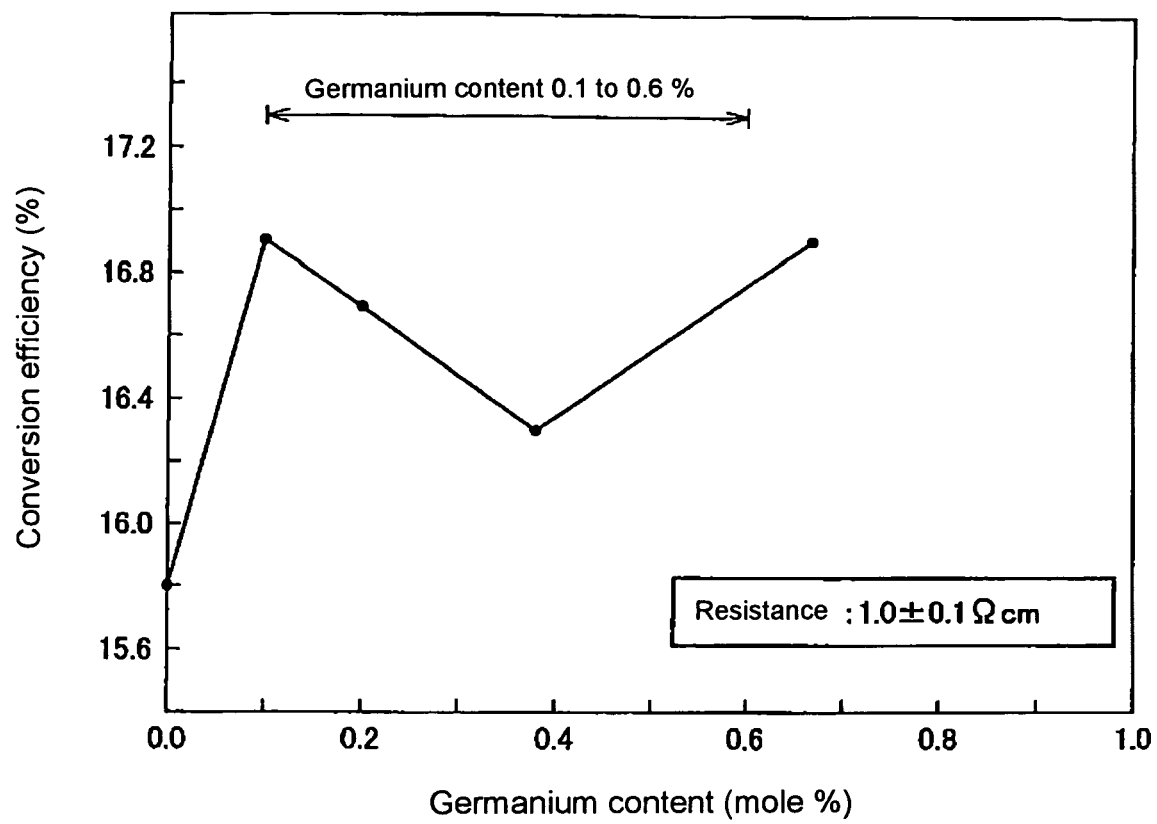
FIG. 2 shows a relationship between the germanium content and the conversion efficiency of the solar cell element when the resistance is as low as resistivity being 1.0±0.1 Ωcm.
Figure 3:
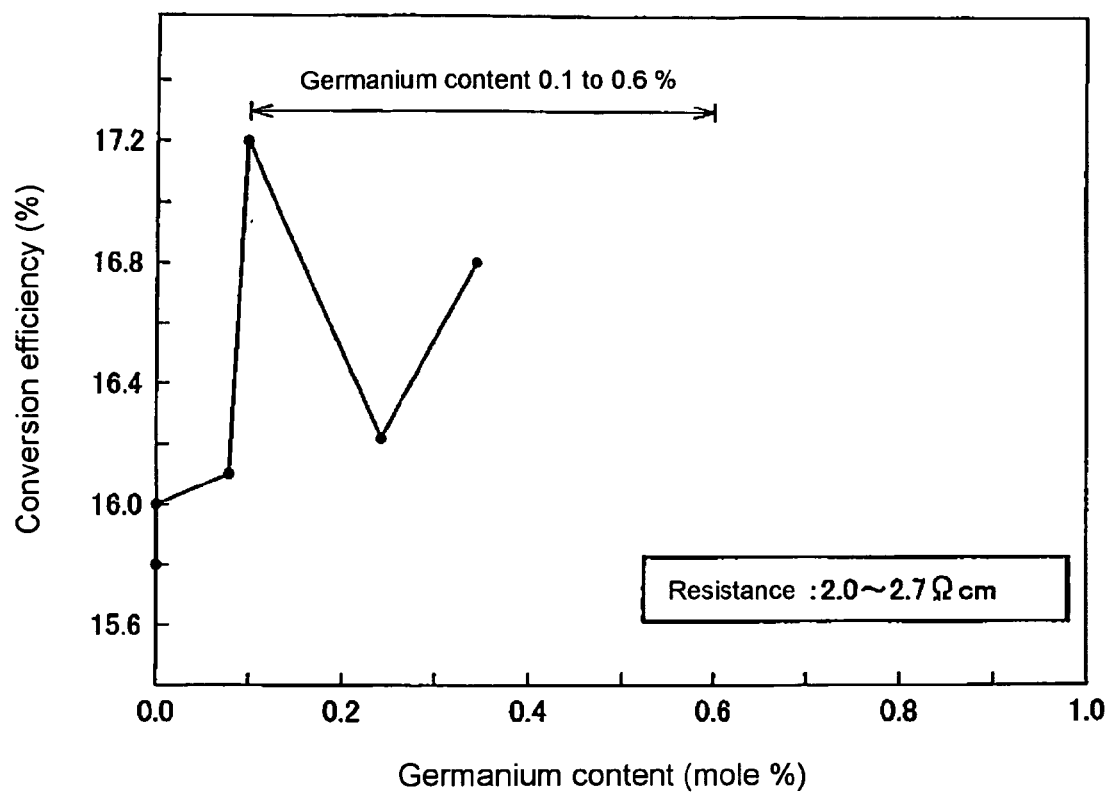
FIG. 3 shows a relationship between the germanium content and the conversion efficiency of the solar cell element when the resistance is as high as resistivity ranging from 2.0 to 2.7 Ωcm.

FIG. 2 shows a relationship between the germanium content and the conversion efficiency of the solar cell element when the resistance is as low as resistivity being 1.0±0.1 Ωcm. FIG. 3 shows a relationship between the germanium content and the conversion efficiency of the solar cell element when the resistance is the high resistivity ranging from 2.0 to 2.7 Ωcm.

As shown in FIGS. 2 and 3, in the solar cell element in which the germanium content is set in the range of not less than 0.1 mole % to not more than 0.6 mole %, the conversion efficiency is enhanced in whole resistance range compared with the solar cell element by the germanium-free single-crystal silicon.

Figure 4:
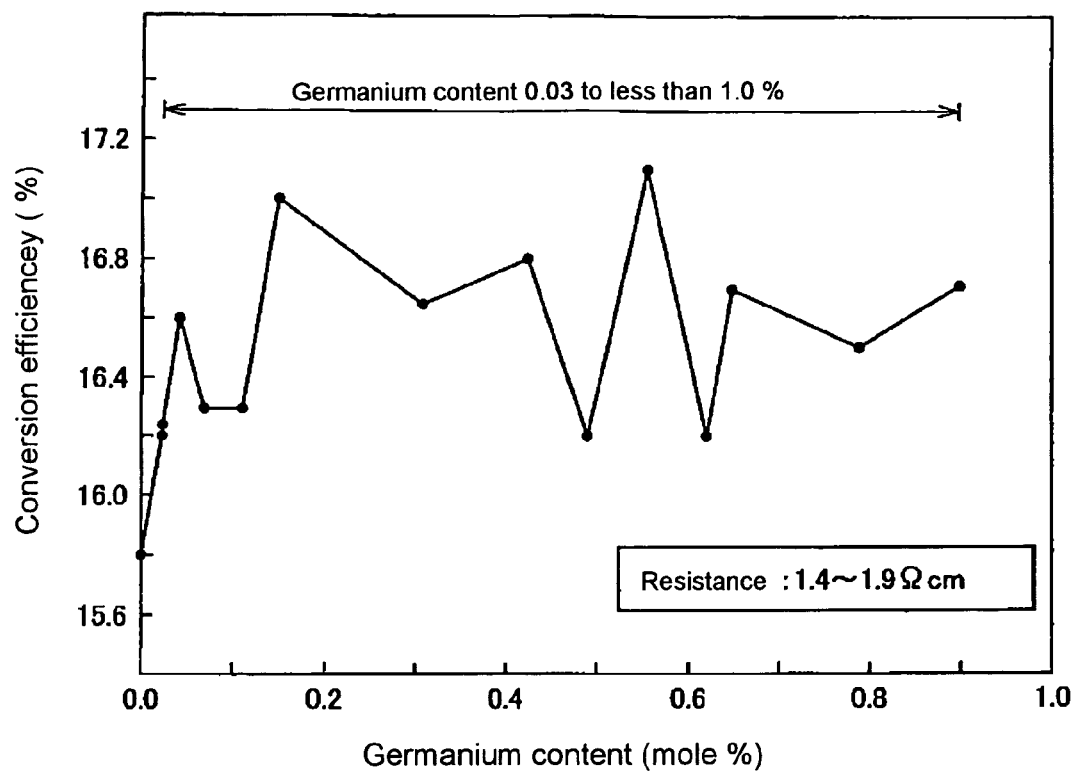
FIG. 4 shows a relationship between the germanium content and the conversion efficiency of the solar cell element when the resistance is as intermediate as resistivity ranging from 1.4 to 1.9 Ωcm.

FIG. 4 shows a relationship between the germanium content and the conversion efficiency of the solar cell element when the resistance is as intermediate as resistivity ranging from 1.4 to 1.9 Ωcm. In the solar cell element by the single-crystal silicon having the intermediate resistivity, because the interaction effect exerted between the inclusion of the germanium and the doping agent or impurities, the conversion efficiency can be enhanced by containing the germanium in the range of not less than 0.03 mole % to less than 1.0 mole % when compared with the solar cell element by the germanium-free single-crystal silicon. Furthermore, as can be seen from the measurement results shown in Tables 3 and 4, the solar cell element characteristics can be stably secured.

Accordingly, when the conventional technology in which the conversion efficiency is enhanced by the single-crystal silicon substrate is applied to the germanium-containing substrate by the present invention, the solar cell having much higher conversion efficiency can be obtained.

As described above, according to the solar-cell single-crystal silicon substrate by the present invention, the germanium content is set in the range of not less than 0.1 mole % to less than 1.0 mole %, desirably the germanium content is set in the range of not less than 0.1 mole % to not more than 0.6 mole %, and the germanium content is set in the range of not less than 0.03 mole % to less than 1.0 mole % when the single-crystal silicon has the intermediate resistivity. Therefore, the conversion efficiency can remarkably be enhanced compared with the case where the conventional single-crystal silicon substrate is used. Accordingly, in the solar-cell single-crystal silicon substrate by the present invention, the solar cell power generation cost is decreased, so that the single-crystal silicon by the present invention can widely be utilized as the solar cell substrate in which the high conversion efficiency is increasingly demanded.

What is claimed is:

1. A solar-cell single-crystal silicon substrate, wherein resistivity ranges from 1.4 to 1.9 Ωcm and a germanium content is not less than 0.03 mole % and less than 0.1 mole %.

2. The solar-cell single-crystal silicon substrate according to claim 1, wherein the solar-cell single-crystal silicon substrate is sliced from single-crystal silicon pulled by a Czochralski method.

3. A solar cell element, wherein the solar-cell single-crystal silicon substrate according to claim 1 is used.

4. A method for producing a solar-cell single-crystal silicon substrate, wherein, in growing a single-crystal silicon by a Czochralski method, after a silicon melt is familiarized with a seed crystal by bringing the seed crystal into contact with the surface of the silicon melt in a crucible, the silicon melt being added with germanium, the single-crystal silicon is pulled while rotated, and the solar-cell single-crystal silicon substrate is sliced from the single-crystal silicon containing germanium, and wherein the resistivity of the single-crystal silicon thus grown ranges from 1.4 to 1.9 Ωcm, the germanium content is adjusted in the range of 0.03 mole % to less than 0.1 mole % according to a grown length of the single crystal.

* * * * *